United States Patent
Su et al.

(10) Patent No.: US 10,615,051 B2
(45) Date of Patent: Apr. 7, 2020

(54) THIN-FILM TRANSISTOR AND METHOD OF MANUFACTURING THE SAME, ARRAY SUBSTRATE, AND DISPLAY APPARATUS

(71) Applicants: BOE Technology Group Co., Ltd., Beijing (CN); HEFEI XINSHENG OPTOELECTRONICS TECHNOLOGY CO., LTD., Anhui (CN)

(72) Inventors: Tongshang Su, Beijing (CN); Dongfang Wang, Beijing (CN); Jun Liu, Beijing (CN); Leilei Cheng, Beijing (CN); Wei Li, Beijing (CN); Qinghe Wang, Beijing (CN); Yang Zhang, Beijing (CN); Guangcai Yuan, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

(*) Notice: Subject to any disclaimer, the term of this patent is extended or adjusted under 35 U.S.C. 154(b) by 0 days.

(21) Appl. No.: 15/983,453

(22) Filed: May 18, 2018

(65) Prior Publication Data

US 2019/0131143 A1    May 2, 2019

(30) Foreign Application Priority Data

Oct. 27, 2017    (CN) .......................... 2017 1 1025701

(51) Int. Cl.
*H01L 21/385*    (2006.01)
*H01L 29/786*    (2006.01)
*H01L 29/66*    (2006.01)

(52) U.S. Cl.
CPC ...... *H01L 21/385* (2013.01); *H01L 29/66969* (2013.01); *H01L 29/7869* (2013.01)

(58) Field of Classification Search
CPC ............. H01L 21/385; H01L 29/66969; H01L 29/7869
(Continued)

(56) References Cited

U.S. PATENT DOCUMENTS 5,899,709 A * 5/1999 Yamazaki ......... H01L 21/32105
438/151
2011/0263085 A1 * 10/2011 Yamazaki ............. H01L 21/383
438/161

FOREIGN PATENT DOCUMENTS

| CN | 1054469 C | 7/2000 |
|---|---|---|
| CN | 102709326 A | 10/2012 |
| CN | 104576745 A | 4/2015 |

OTHER PUBLICATIONS

Copy of Office Action, including Search Report, for Chinese Patent Application No. 201711025701.0, dated Dec. 4, 2019, 12 pages.

* cited by examiner

*Primary Examiner* — Tong-Ho Kim
(74) *Attorney, Agent, or Firm* — Westman, Champlin & Koehler, P.A.

(57) ABSTRACT

In an embodiment, there is provided a method of manufacturing a thin-film transistor. The method includes steps of: forming a gate, a gate insulator layer and an active layer on a base substrate, wherein, the gate and the active layer are provided at upper and lower sides of the gate insulator layer, respectively, and the active layer contains impurity ions therein; and, while implementing an annealing on the active layer, applying a voltage between the active layer and the gate to generate an electrical field therebetween, a direction of the electrical field being configured such that the impurity (Continued)

ions move from the active layer into the gate insulator layer. Meanwhile, there are also provided a thin-film transistor, an array substrate and a display apparatus.

14 Claims, 2 Drawing Sheets

(58) Field of Classification Search
USPC .......................................................... 257/43
See application file for complete search history.

THIN-FILM TRANSISTOR AND METHOD OF MANUFACTURING THE SAME, ARRAY SUBSTRATE, AND DISPLAY APPARATUS

CROSS-REFERENCE TO RELATED APPLICATION

This application claims priority to Chinese Patent Application No. 201711025701.0 filed on Oct. 27, 2017 in the State Intellectual Property Office of China, the disclosure of which is hereby incorporated by reference in its entirety.

TECHNICAL FIELD

The present disclosure relates to the field of display technology, and particularly, to a thin-film transistor and a method of manufacturing the same, an array substrate, and a display apparatus.

BACKGROUND

In the field of liquid crystal display technology, manufacturing process of a thin-film transistor has an important influence on performance of the thin-film transistor.

SUMMARY

According to an aspect of the present disclosure, there is provided a method of manufacturing a thin-film transistor. The method comprises steps of: forming a gate, a gate insulator layer and an active layer on a base substrate, wherein, the gate and the active layer are provided at upper and lower sides of the gate insulator layer, respectively, and the active layer contains impurity ions therein; and while implementing an annealing on the active layer, applying a voltage between the active layer and the gate to generate an electrical field therebetween, a direction of the electrical field being configured such that the impurity ions move from the active layer into the gate insulator layer.

In some embodiments, the impurity ions comprise hydrogen ions, and the direction of the electrical field is directed from the active layer to the gate.

In some embodiments, a material of which the active layer is made comprises an oxide semiconductor material, the active layer further contains oxygen vacancies therein, and a material of which the gate insulator layer is made comprises an oxide insulating material.

In some embodiments, the oxide semiconductor material comprises indium gallium zinc oxide, and the oxide insulating material comprises silicon oxide.

In some embodiments, the step of applying a voltage between the active layer and the gate to generate an electrical field therebetween, a direction of the electrical field being configured such that the impurity ions move from the active layer into the gate insulator layer, comprises: grounding the active layer and applying a negative bias on the gate to generate the electrical field therebetween, the direction of the electrical field being configured such that the impurity ions move from the active layer into the gate insulator layer.

In some embodiments, the gate, the gate insulator layer and the active layer are formed to be away from the base substrate in that order; and, before the step of, while implementing an annealing on the active layer, applying a voltage between the active layer and the gate to generate an electrical field therebetween, a direction of the electrical field being configured such that the impurity ions move from the active layer into the gate insulator layer, the method further comprises: forming an etch stop layer on the active layer, the etch stop layer being formed with a first via hole and a second via hole through which the active layer is exposed, and a material of which the etch stop layer is made comprises an oxide insulating material.

In some embodiments, after the step of forming an etch stop layer on the active layer, the method further comprises: forming a source and a drain on the etch stop layer, the source and the drain being directly connected respectively with the active layer through the first via hole and the second via hole.

According to another aspect of the present disclosure, there is provided a thin-film transistor. The thin-film transistor comprises: a base substrate, and a gate, a gate insulator layer and an active layer on the base substrate. The gate and the active layer are provided at upper and lower sides of the gate insulator layer, respectively, and the active layer contains impurity ions therein. The gate, the gate insulator layer and the active layer are configured such that, while an annealing is implemented on the active layer, a voltage is applied between the active layer and the gate to generate an electrical field therebetween, a direction of the electrical field being configured such that the impurity ions move from the active layer into the gate insulator layer.

In some embodiments, the impurity ions comprise hydrogen ions, and the direction of the electrical field is directed from the active layer to the gate.

In some embodiments, a material of which the active layer is made comprises an oxide semiconductor material, the active layer further contains oxygen vacancies therein, and a material of which the gate insulator layer is made comprises an oxide insulating material.

In some embodiments, the oxide semiconductor material comprises indium gallium zinc oxide, and the oxide insulating material comprises silicon oxide.

In some embodiments, the active layer is grounded and a negative bias is applied on the gate to generate the electrical field therebetween, the direction of the electrical field being configured such that the impurity ions move from the active layer into the gate insulator layer.

In some embodiments, the gate, the gate insulator layer and the active layer are formed to be away from the base substrate in that order; an etch stop layer is formed on the active layer, the etch stop layer being formed with a first via hole and a second via hole through which the active layer is exposed, and a material of which the etch stop layer is made comprises an oxide insulating material.

In some embodiments, a source and a drain are formed on the etch stop layer, and, the source and the drain are directly connected respectively with the active layer through the first via hole and the second via hole.

According to yet another aspect of the present disclosure, there is provided an array substrate comprising the thin-film transistor of any one of the above embodiments.

According to still another aspect of the present disclosure, there is provided a display apparatus comprising the array substrate of any one of the above embodiments.

BRIEF DESCRIPTION OF THE DRAWINGS

In order to provide a more clear explanation of embodiments of the present disclosure or solutions in related art, there is provided a brief introduction of the attached drawings used in the following description of the embodiments and the solutions in related art. Obviously, the drawings mentioned in the following description belong to some embodiments of the present disclosure. However, for those

DETAILED DESCRIPTION OF THE EMBODIMENTS

A clear and complete description of technical solutions in embodiments of the present disclosure and solutions in related art will be made as below in conjunction with the accompanying drawings in the embodiments of the present disclosure and related art. Apparently, the described embodiments are some of the embodiments of the present disclosure rather than all of the embodiments of the present disclosure. All other embodiments derived by those skilled in the art based on the embodiments of the present disclosure without making a creative work shall fall within the protection scope of the present disclosure.

It should be noted that, unless otherwise specified and defined definitely, all the terms (including technical and scientific terms) used in the embodiments of the present disclosure have the same meaning as commonly understood by those skilled in the art to which the present disclosure pertains. It should also be understood that terms such as those defined in a typical dictionary should be construed as having a meaning consistent with their meaning in the context of the related art without being interpreted in an idealized or extremely formal sense unless otherwise specified and defined definitely herein.

For example, the terms "first", "second" and the like, as used in the specification and claims of this disclosure, do not denote any order, quantity, or importance, but are only used to distinguish between different components. The use of "comprising" or "including", and the like, means that a component or an item preceding the word encompasses element(s) or item(s) listed after the word and their equivalents, without excluding other elements or items. Orientations or positional relationships denoted by terminologies "upper/above", "lower/below" and the likes are those shown in the figures, and only intended for easing or simplifying the description of embodiments of the present disclosure, instead of expressing or implying that the devices or elements should be located at specific orientations or should be configured or manipulated at specific orientations, accordingly, they are not intended to limit the scope of the present disclosure.

Figure 1:
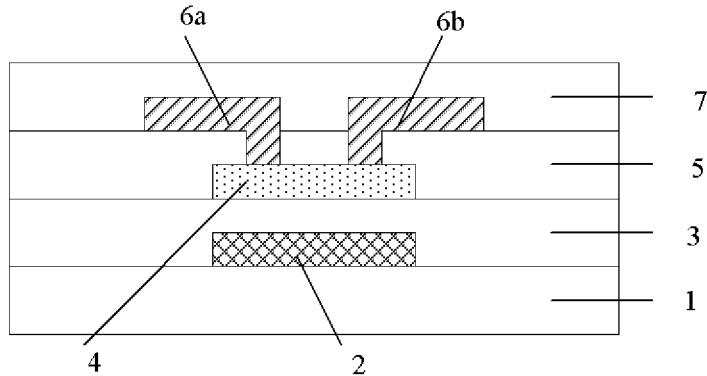
FIG. 1 is a schematic view showing a structure of a thin-film transistor in related art.

In related art, a structure of a thin-film transistor is shown in FIG. 1. On a base substrate 1, a gate 2, a gate insulator layer (GI) 3, an active layer (ACT) 4, an etch stop layer (ESL) 5, and a source 6a and a drain 6b are formed. The thin-film transistor is commonly also covered with a passivation protection layer (PVX) 7.

In a related manufacturing process of a thin-film transistor, in order to prevent excess hydrogen ions ($H^+$) from entering the active layer 4, thereby adversely affecting performance of the thin-film transistor, both the gate insulator layer 3 and the etch stop layer 5 are typically made of single silicon oxide ($SiO_x$) material, instead of being made of silicon nitride (SiN) material or silicon oxynitride (SiON) material.

However, in this related manufacturing process, the gate insulator layer 3 and the etch stop layer 5 made of silicon oxide material are generally deposited by a plasma enhanced chemical vapor deposition (PECVD) method, and $N_2O$ 和 $SiH_4$ are used. With this process, a certain amount of impurity hydrogen ions ($H^+$) are still presented in the gate insulator layer 3 and the etch stop layer 5, and these hydrogen ions ($H^+$) partially enter the active layer 4. In particular, these hydrogen ions ($H^+$) in the gate insulator layer 5 directly diffuse into a conductive channel region of the thin-film transistor active layer 4, resulting in deterioration of the performance of the thin-film transistor.

Figure 2:
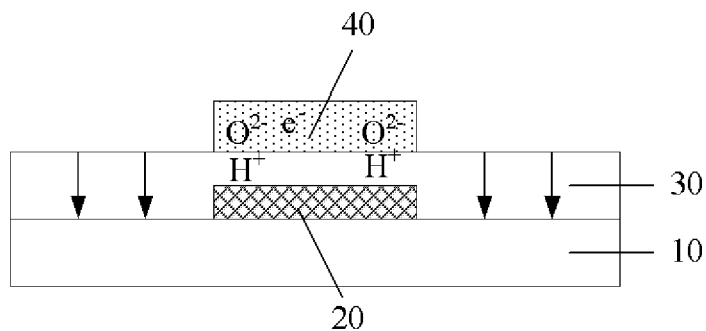
FIG. 2 is a schematic view showing a structure of a thin-film transistor according to an embodiment of the present disclosure when being processed in a method of manufacturing the thin-film transistor.
Figure 3:
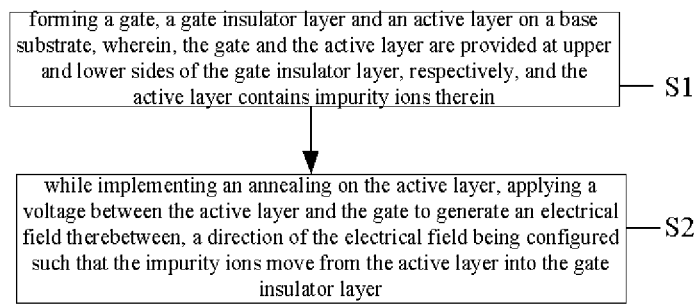
FIG. 3 is a flow diagram showing a method of manufacturing a thin-film transistor according to an embodiment of the present disclosure.

Referring to FIG. 2 and FIG. 3, according to an embodiment of the present disclosure, there is provided a method of manufacturing a thin-film transistor, and the method at least comprising:

a step S1 of forming a gate 20, a gate insulator layer 30 and an active layer 40 on a base substrate 10, wherein, the gate 20 and the active layer 40 are provided at upper and lower sides of the gate insulator layer 30, respectively, and the active layer 40 contains impurity ions therein; and a step S2 of while implementing an annealing on the active layer 40, applying a voltage between the active layer 40 and the gate 20 to generate an electrical field therebetween, a direction of the electrical field being configured such that the impurity ions move from the active layer 40 into the gate insulator layer 30.

It should be noted that, implementing a high-temperature annealing on the active layer 40 can reduce structural defects in the active layer 40 and other layers, meanwhile, the high temperature used in the annealing increases activity of the impurity ions (e.g., hydrogen ions) in the active layer 40, which facilitates the movement of the impurity ions under the action of the electric field, thereby being advantageous to reduce the content of the impurity ions in the active layer 40. In some examples, even if the concentration of the impurity ions in the gate insulator layer 30 is greater than the concentration of the impurity ions in the active layer 40 (that is, the concentration of the impurity ions increases in the direction from the active layer 40 to the gate insulator layer 30), the impurity ions can also move from the active layer 40 into the gate insulator layer 30 under the action of the electric field.

Here, the temperature used in implementing the annealing on the active layer 40 may be set flexibly according to specific material of the active layer 40, and it is not limited in the embodiments of the present disclosure.

Based on the above, in the method according to embodiments of the present disclosure, the active layer 40 is further processed after it is formed. In particular, while implementing a high-temperature annealing on the active layer 40, a voltage is applied between the active layer 40 and the gate 20 to generate therebetween the electrical field moving the impurity ions from the active layer 40 into the gate insulator layer 30, which adjusts the content of the impurity ions in the active layer 40, thereby reducing the content of the impurity ions and improving performance of the thin-film transistor.

According to embodiments of the present disclosure, the voltage is applied between the active layer 40 and the gate 20 to generate the electrical field therebetween, and the direction of the electrical field is configured such that the impurity ions move from the active layer 40 to the gate insulator layer 30. Here, referring to FIG. 2, positive hydrogen ions ($H^+$) is taken as an example of the impurity ions in the active layer 40, a direction of the electrical field generated between the active layer 40 and the gate 20, as indicated by the arrow in this figure, is directed from the active layer 40 towards the gate 20.

In some embodiments, a material of which the active layer 40 is made comprises an oxide semiconductor material, the active layer 40 further contains oxygen vacancies therein, and a material of which the gate insulator layer 30 is made comprises an oxide insulating material such as silicon oxide.

In some embodiments, the active layer 40 is made of oxide semiconductor material with relatively high carrier mobility, such as Indium Gallium Zinc Oxide (IGZO).

During the deposition of the oxide semiconductor material, an oxygen deficiency is inevitably generated, which results in leaving positive vacancies, namely oxygen vacancies, in the oxide semiconductor lattice structure. Presence of the oxygen vacancies further deteriorates the performance of the oxide thin-film transistor.

In the embodiment shown in FIG. 2, the abovementioned step S2 is performed on the active layer 40 made of oxide semiconductor material, to move hydrogen ions ($H^+$) in the active layer 40 and electron/oxygen ions ($e^-/O^{2-}$) in the gate insulator layer 30 toward each other. The $H^+$ in the active layer 40 and the $e^-/O^{2-}$ in the gate insulator layer 30 are exchanged, the $H^+$ enters the gate insulator layer 30, and the $e^-/O^{2-}$ in the gate insulator layer 30 enters the active layer 40 and combines with positive oxygen vacancies, reducing the number of oxygen vacancies in the active layer 40, thereby reducing the contents of hydrogen ions and of oxygen vacancies in the active layer 40, further improving the performance of the formed oxide thin-film transistor. It should be noted that, FIG. 2 shows a situation after performing the above-mentioned step S2, that is, the electron/oxygen ion ($e^-/O^{2-}$) has entered the active layer 40, and the hydrogen ion ($H^+$) has entered the gate insulator layer 30.

According to embodiments of the present disclosure, in order to reduce operation difficulty of the method, the step of applying a voltage between the active layer 40 and the gate 20 to generate an electrical field therebetween, a direction of the electrical field being configured such that the impurity ions move from the active layer into the gate insulator layer 30, may comprise:

grounding the active layer 40 (namely, an electric potential applied on the active layer 40 is zero) and applying a negative bias on the gate 20 to generate the electrical field therebetween, the direction of the electrical field being configured such that the impurity ions move from the active layer 40 into the gate insulator layer 30.

Here, the abovementioned "negative bias" means that the electric potential specifically applied on the gate 20 is negative with respect to the grounded active layer 40.

According to embodiments of the present disclosure, depending on the specific materials of the active layer 40 and the gate insulator layer 30, different negative biases may be applied on the gate 20, that is, strength of the formed electric field is adjusted to specifically adjust degrees of the movements of $H^+$ and $e^-/O^{2-}$ in the active layer 40 and the gate insulator layer 30.

Figure 4:
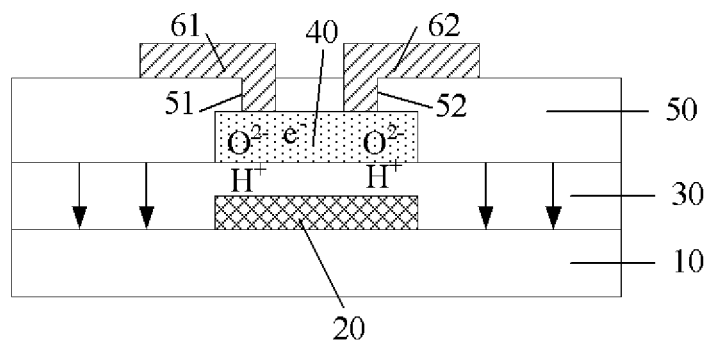
FIG. 4 is a schematic view showing another structure of a thin-film transistor according to an embodiment of the present disclosure when being processed in a method of manufacturing the thin-film transistor.
Figure 5:
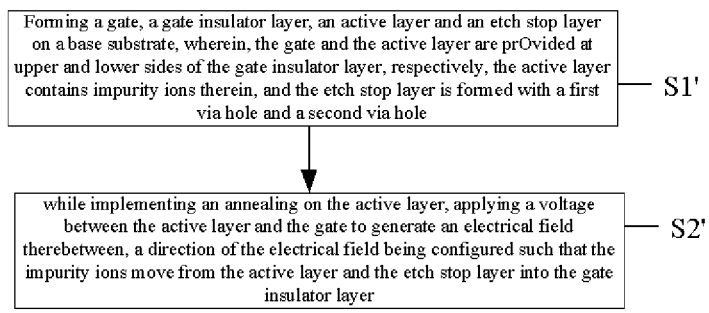
FIG. 5 is another flow diagram showing a method of manufacturing a thin-film transistor according to an embodiment of the present disclosure.

According to embodiments of the present disclosure, based on the above, further, referring to FIG. 4 and FIG. 5, the gate 20, the gate insulator layer 30 and the active layer 40 are formed to be away from the base substrate in that order, accordingly, before the step S2, the method according to embodiments of the present disclosure further comprises:

forming an etch stop layer 50 on the active layer 40, the etch stop layer being formed with a first via hole 51 and a second via hole 52 through which the active layer 40 is exposed, and a material of which the etch stop layer 50 is made comprises an oxide insulating material.

Here, since the etch stop layer is also usually a silicon nitride material deposited by a PECVD method, hydrogen ions ($H^+$) in the etch stop layer may also migrate into the active layer 40. Accordingly, in some embodiments of the present disclosure, after the etch stop layer 50 is formed and before the source and the drain are formed, the active layer 40 is annealed and an electric field treatment is performed, so that these impurity ions (e.g., $H^+$) having entered the active layer 40 from the etch stop layer 50 can also move out of the active layer 40 under the action of the electric field, further reducing the influence of the preparation process of the etch stop layer 50 on the performance of the active layer 40 and improving the performance of the formed thin-film transistor.

Moreover, after the step of forming an etch stop layer on the active layer 40, the method further comprises: forming a source 61 and a drain 62 on the etch stop layer, the source 61 and the drain 62 being directly connected respectively with the active layer 40 through the first via hole 51 and the second via hole 52.

It should be noted that, the step of forming the source 61 and the drain 62 may be implemented before annealing the active layer 40 and applying an electric field, or may be implemented after annealing the active layer 40 and applying the electric field, and it is not limited in the embodiments of the present disclosure as long as a source and a drain that are electrically connected to the active layer 40 are formed. It should be noted that, FIG. 4 shows a situation after performing the steps of annealing and applying the electric field on the active layer 40. That is, the electron/oxygen ion ($e^-/O^{2-}$) has entered the active layer 40, and the hydrogen ion ($H^+$) has entered the gate insulator layer 30.

According to another embodiment of the present disclosure, there is provided a thin-film transistor manufactured by the method according to any one of the abovementioned embodiments of the present disclosure. According to the embodiment of the present disclosure, referring to FIG. 2, a thin-film transistor comprises: a base substrate 10, and a gate 20, a gate insulator layer 30 and an active layer 40 on the base substrate 10, wherein, the gate 20 and the active layer 40 are provided at upper and lower sides of the gate insulator layer 30, respectively, and the active layer 40 contains impurity ions therein; and wherein, the gate 20, the gate insulator layer 30 and the active layer 40 are configured such that, while an annealing is implemented on the active layer 40, a voltage is applied between the active layer 40 and the gate 20 to generate an electrical field therebetween, a direction of the electrical field being configured such that the impurity ions move from the active layer 40 into the gate insulator layer 30.

According to an embodiment of the present disclosure, the impurity ions are hydrogen ions, and the direction of the electrical field is directed from the active layer 40 towards the gate 20. A material of which the active layer 40 is made may be an oxide semiconductor material with relatively high carrier mobility, such as Indium Gallium Zinc Oxide (IGZO). The active layer 40 contains oxygen vacancies. A material of which the gate insulator layer 30 is made comprises an oxide insulating material such as silicon oxide. In some examples, the active layer 40 is grounded and a negative bias is applied on the gate 20 to generate the electrical field therebetween, the direction of the electrical field being configured such that the impurity ions move from the active layer 40 into the gate insulator layer 30.

According to an embodiment of the present disclosure, as shown in FIG. 4, in the thin-film transistor, the gate 20, the gate insulator layer 30 and the active layer 40 are formed to be away from the base substrate 10 in that order; and an etch stop layer 50 is formed on the active layer 40, the etch stop layer 50 being formed with a first via hole 51 and a second via hole 52 through which the active layer 40 is exposed. A source 61 and a drain 62 are formed on the etch stop layer 50, and the source 61 and the drain 62 are directly connected respectively with the active layer 40 through the first via hole 51 and the second via hole 52. A material of which the etch stop layer 50 is made may be an oxide insulating material.

In some examples, even if the concentration of the impurity ions in the gate insulator layer 30 is greater than the concentration of the impurity ions in the active layer 40 (that is, the concentration of the impurity ions increases in the direction from the active layer 40 to the gate insulator layer 30), the gate 20, the gate insulator layer 30 and the active layer 40 are configured such that, the impurity ions can move from the active layer 40 into the gate insulator layer 30 under the action of the electric field.

According to yet another embodiment of the present disclosure, there is provided an array substrate comprising the thin-film transistor according to the abovementioned embodiments.

It should be noted that the array substrate may further specifically include: a gate line, a gate line lead wire and the like arranged in a same layer formed by a same patterning process as the gate of the thin-film transistor; a data line, a date line lead wire, a power supply line and the like arranged in a same layer formed by a same patterning process as the source and the drain of the thin-film transistor; and a pixel electrode (or an anode), and a common electrode (or a cathode) opposite to the pixel electrode and the like, which are electrically connected to the drain of the thin-film transistor. The details may refer to related technologies in the art, and it is not limited in the embodiments of the present disclosure.

Based on the above, according to still another embodiment of the present disclosure, there is provided a display apparatus comprising the array substrate according to the abovementioned embodiments.

The display apparatus specifically may be a liquid crystal display apparatus, for example, a liquid crystal display, a liquid crystal television, or may be organic electroluminescence display apparatuses, such as any products and components having a display function, such as an organic electroluminescence display, an organic electroluminescence television, a digital photo frame, a mobile phone, a tablet computer, a navigator and the like.

The above description is merely used to illustrate specific embodiments of the present disclosure, but not to limit the present disclosure. Although a detailed description of embodiments of the present disclosure with reference to the attached drawings is provided, it should be understood by those skilled in the art that, all of changes, equivalent alternatives, modifications, made within principles and spirit of the present disclosure, should be included within the scope of the present disclosure, and the scope of present disclosure is defined in the claims and their equivalents.

What is claimed is:

1. A method of manufacturing a thin-film transistor, the method comprising steps of:

Forming, on a base substrate, a gate, a gate insulator layer made of an oxide insulating material, and an active layer made of an oxide semiconductor material and containing oxygen vacancies therein, wherein, the gate and the active layer are provided at upper and lower sides of the gate insulator layer, respectively, and the active layer contains hydrogen ions therein; and while implementing an annealing on the active layer, applying a voltage between the active layer and the gate to generate an electrical field therebetween, a direction of the electrical field being configured such that the hydrogen ions move from the active layer into the gate insulator layer, and the hydrogen ions in the active layer and electron/oxygen ions in the gate insulator layer are moved/exchanged toward/with each other, such that the hydrogen ions enter the gate insulator layer, and the electron/oxygen ions in the gate insulator layer enter the active layer and combine with positive oxygen vacancies, thereby reducing the contents of the hydrogen ions and of the oxygen vacancies in the active layer.

2. The method of claim 1, wherein, impurity ions comprise the hydrogen ions, and the direction of the electrical field is directed from the active layer to the gate.

3. The method of claim 2, wherein, the step of applying a voltage between the active layer and the gate to generate an electrical field therebetween, a direction of the electrical field being configured such that the impurity ions move from the active layer into the gate insulator layer, comprises:

grounding the active layer and applying a negative bias on the gate to generate the electrical field therebetween, the direction of the electrical field being configured such that the impurity ions move from the active layer into the gate insulator layer.

4. The method of claim 1, wherein, the oxide semiconductor material comprises indium gallium zinc oxide, and the oxide insulating material comprises silicon oxide.

5. The method of claim 1, wherein, the gate, the gate insulator layer and the active layer are formed to be away from the base substrate in that order; and before the step of, while implementing an annealing on the active layer, applying a voltage between the active layer and the gate to generate an electrical field therebetween, a direction of the electrical field being configured such that the impurity ions move from the active layer into the gate insulator layer, the method further comprises:

forming an etch stop layer on the active layer, the etch stop layer being formed with a first via hole and a second via hole through which the active layer is exposed, and a material of which the etch stop layer is made comprises an oxide insulating material.

6. The method of claim 5, after the step of forming an etch stop layer on the active layer, the method further comprising:

forming a source and a drain on the etch stop layer, the source and the drain being directly connected respectively with the active layer through the first via hole and the second via hole.

7. A thin-film transistor manufactured by the method of claim 1, the thin-film transistor comprising: the base substrate, and the gate, the gate insulator layer and the active layer on the base substrate, the gate insulator layer being made of the oxide insulating material, and the active layer being made of the oxide semiconductor material and containing the oxygen vacancies therein;
- wherein, the gate and the active layer are provided at upper and lower sides of the gate insulator layer, respectively, and the active layer contains impurity ions therein; and
- wherein, the gate, the gate insulator layer and the active layer are configured such that, while the annealing is implemented on the active layer, the voltage is applied between the active layer and the gate to generate the electrical field therebetween, the direction of the electrical field being configured such that the impurity ions move from the active layer into the gate insulator layer, and the hydrogen ions in the active layer and the electron/oxygen ions in the gate insulator layer are moved/exchanged toward/with each other, such that the hydrogen ions enter the gate insulator layer, and the electron/oxygen ions in the gate insulator layer enter the active layer and combine with the positive oxygen vacancies, thereby reducing the contents of the hydrogen ions and of the oxygen vacancies in the active layer.

8. The thin-film transistor of claim 7, wherein, the impurity ions comprise the hydrogen ions, and the direction of the electrical field is directed from the active layer to the gate.

9. The thin-film transistor of claim 8, wherein, the active layer is grounded and a negative bias is applied on the gate to generate the electrical field therebetween, the direction of the electrical field being configured such that the impurity ions move from the active layer into the gate insulator layer.

10. The thin-film transistor of claim 7, wherein, the oxide semiconductor material comprises indium gallium zinc oxide, and the oxide insulating material comprises silicon oxide.

11. The thin-film transistor of claim 7, wherein, the gate, the gate insulator layer and the active layer are formed to be away from the base substrate in that order; and
- an etch stop layer is formed on the active layer, the etch stop layer being formed with a first via hole and a second via hole through which the active layer is exposed, and a material of which the etch stop layer is made comprises an oxide insulating material.

12. The thin-film transistor of claim 11, wherein,
- a source and a drain are formed on the etch stop layer, and
- the source and the drain are directly connected respectively with the active layer through the first via hole and the second via hole.

13. An array substrate comprising the thin-film transistor of claim 7.

14. A display apparatus comprising the array substrate of claim 13.

* * * * *